(12) United States Patent
Tai et al.

(10) Patent No.: US 10,147,754 B2
(45) Date of Patent: Dec. 4, 2018

(54) BACKSIDE ILLUMINATED IMAGE SENSOR WITH IMPROVED CONTACT AREA

(71) Applicant: OMNIVISION TECHNOLOGIES, INC., Santa Clara, CA (US)

(72) Inventors: Dyson H. Tai, San Jose, CA (US); Cunyu Yang, Milpitas, CA (US); Gang Chen, San Jose, CA (US); Jing Ye, Shanghai (CN); Xi-Feng Gao, Shanghai (CN); Jiaming Xing, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 144 days.

(21) Appl. No.: 15/439,793

(22) Filed: Feb. 22, 2017

(65) Prior Publication Data
US 2018/0240833 A1   Aug. 23, 2018

(51) Int. Cl.
*H01L 27/00* (2006.01)
*H01L 27/146* (2006.01)

(52) U.S. Cl.
CPC .... *H01L 27/14636* (2013.01); *H01L 27/1463* (2013.01); *H01L 27/1464* (2013.01); *H01L 27/14643* (2013.01); *H01L 27/14689* (2013.01)

(58) Field of Classification Search
CPC ............. H01L 31/062; H01L 27/14636; H01L 27/1464

USPC ........... 250/208.1, 214.1; 257/447, 448, 457, 257/459
See application file for complete search history.

(56) References Cited

U.S. PATENT DOCUMENTS

| | | | |
|---|---|---|---|
| 7,741,666 B2 * | 6/2010 | Nozaki | ............... H01L 27/1464 257/292 |
| 8,987,855 B2 | 3/2015 | Lin et al. | |
| 2003/0015732 A1 * | 1/2003 | Park | .................. H01L 21/76897 257/200 |
| 2013/0009270 A1 | 1/2013 | Tsai et al. | |

* cited by examiner

*Primary Examiner* — Kevin Pyo
(74) *Attorney, Agent, or Firm* — Christensen O'Connor Johnson Kindness PLLC

(57) ABSTRACT

An image sensor includes a semiconductor material having a front side and a back side opposite the front side. The image sensor also includes a shallow trench isolation (STI) structure, an interlayer dielectric, an intermetal dielectric, and a contact area. The STI structure extends from the front side of the semiconductor material into the semiconductor material. The interlayer dielectric is disposed between the front side of the semiconductor material and the intermetal dielectric. The contact area is disposed proximate to a lateral edge of the semiconductor material. The contact area includes a metal interconnect disposed within the intermetal dielectric and a plurality of contact plugs at least partially disposed within the interlayer dielectric. The contact area also includes a contact pad. The plurality of contact plugs is coupled between the contact pad and the metal interconnect.

20 Claims, 4 Drawing Sheets

BACKSIDE ILLUMINATED IMAGE SENSOR WITH IMPROVED CONTACT AREA

TECHNICAL FIELD

This disclosure relates generally to semiconductor image sensors, and in particular but not exclusively, relates to backside illuminated semiconductor image sensors.

BACKGROUND INFORMATION

Image sensors have become ubiquitous. They are widely used in digital still cameras, cellular phones, security cameras, as well as, medical, automobile, and other applications. The device architecture of image sensors has continued to advance at a great pace due to increasing demands for higher resolution, lower power consumption, increased dynamic range, etc. These demands have also encouraged the further miniaturization and integration of image sensors into these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

The miniaturization of image sensors may decrease the distance between individual elements of the image sensor. This decreased distance may result in an increased susceptibility to metal contamination. Metal from one element of an image sensor may inadvertently contaminate a different element. For example, copper from an electrode may diffuse or otherwise propagate into a semiconductor material of the image sensor resulting in copper metal contamination. Metal contaminants may act as deep level traps within the semiconductor material and have a detrimental effect on image sensor performance.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
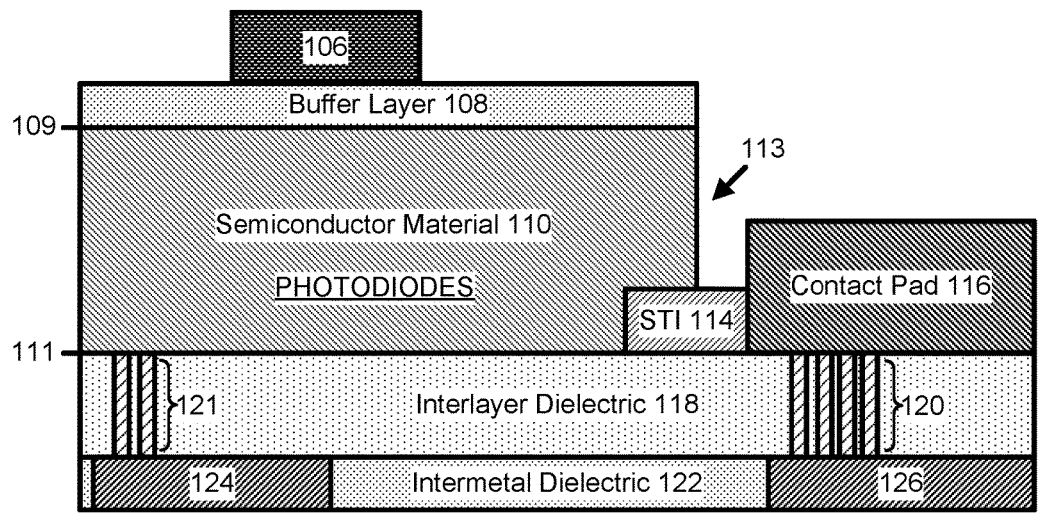
FIG. 1A is a cross sectional illustration of an example image sensor with an improved contact area, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with improved contact area are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example image sensor 100-A with improved contact area. Image sensor 100-A includes back side metal 106, buffer layer 108, semiconductor material 110 (including back side 109, front side 111, and lateral edge 113), plurality of photodiodes, shallow trench isolation (STI) structure 114, contact pad 116, interlayer dielectric 118, plurality of contact plugs 120 and 121, intermetal dielectric 122, and metal interconnects 124 and 126.

As illustrated, image sensor 100-A includes semiconductor material 110 having front side 111 and back side 109 opposite of front side 111. Semiconductor material 110 includes a plurality of photodiodes disposed between front side 111 and back side 109. Image sensor 100-A also includes buffer layer 108 disposed on semiconductor material 110 between back side metal 106 and back side 109 of semiconductor material 110. STI structure 114 extends from front side 111 of semiconductor material 110 into semiconductor material 110. Interlayer dielectric 118 is disposed between front side 111 of semiconductor material 110 and intermetal dielectric 122. Disposed within intermetal dielectric 122 is front side metal 124. A contact area is disposed proximate to lateral edge 113 of semiconductor material 110. The contact area includes metal interconnect 126, plurality of contact plugs 120, and contact pad 116. Metal interconnect 126 is disposed within intermetal dielectric 122. Plurality of contact plugs 120 is coupled between contact pad 116 and metal interconnect 126. As illustrated, plurality of contact plugs 120 is disposed between contact pad 116 and metal interconnect 126. Plurality of contact plugs 120 is at least partially disposed within interlayer dielectric 118 and is disposed between contact pad 116 and metal interconnect 126.

In one example, the composition of buffer layer 108, interlayer dielectric 118, STI structure 114, and intermetal dielectric 122 may be different. For example, interlayer dielectric 118 and intermetal dielectric 122 may have different chemical compositions.

In another example, the composition of plurality of contact plugs 120 may be different than the composition of contact pad 116 or metal interconnect 126. For example, contact pad 116 may include at least one of aluminum or copper. Plurality of contact plugs 120 may include tungsten, and metal interconnect 126 may include copper. Plurality of contact plugs 120 may electrically couple contact pad 116 to metal interconnect 126 to allow a signal to propagate between a front side and back side of the image sensor.

Plurality of contact plugs 120 may mitigate the risk of metal contamination. For example, during fabrication of image sensor 100-A, processing from the back side 109 of semiconductor material 110 will not expose metal interconnect 126. This is because contact pad 116 stops at front side 111 of semiconductor material 110. Plurality of contact plugs 120 may have a composition that does not cause metal contamination during the etching process used to form contact pad 116. For example, when etching to semiconductor material 110 to form a deep trench for contact pad 116, plurality of contact plugs 120 may not react to the etching process, or may have a substantially slower etch rate than the material to be etched (e.g. semiconductor material 110). Additionally, image sensor 100-A may help reduce fabrication cost by minimizing the number of photolithography steps required by etching semiconductor material 110 and buffer layer 108 with the same mask.

As illustrated, STI structure 114 may extend from lateral edge 113 of semiconductor material 110 towards contact pad 116 such that a first portion of STI structure 114 is disposed between lateral edge 113 of semiconductor material 110 and contact pad 116. STI structure 114 and contact pad 116 may be aligned such that a side of STI structure 114 and contact pad 116 lies on a plane formed by the front side of semiconductor material 110. The thickness of STI structure 114 may be less than the thickness of contact pad 116 resulting in a trench between semiconductor material 110 and contact pad 116 proximate to the first portion of STI structure 114. The trench helps prevent contact pad 116 from shorting with semiconductor material 110.

In one example, contact pad 116 may interface with STI structure 114 and interlayer dielectric 118. As illustrated, image sensor 100-A may have a triple point where contact pad 116, STI structure 114, and interlayer dielectric 118 meet.

Figure 1B:
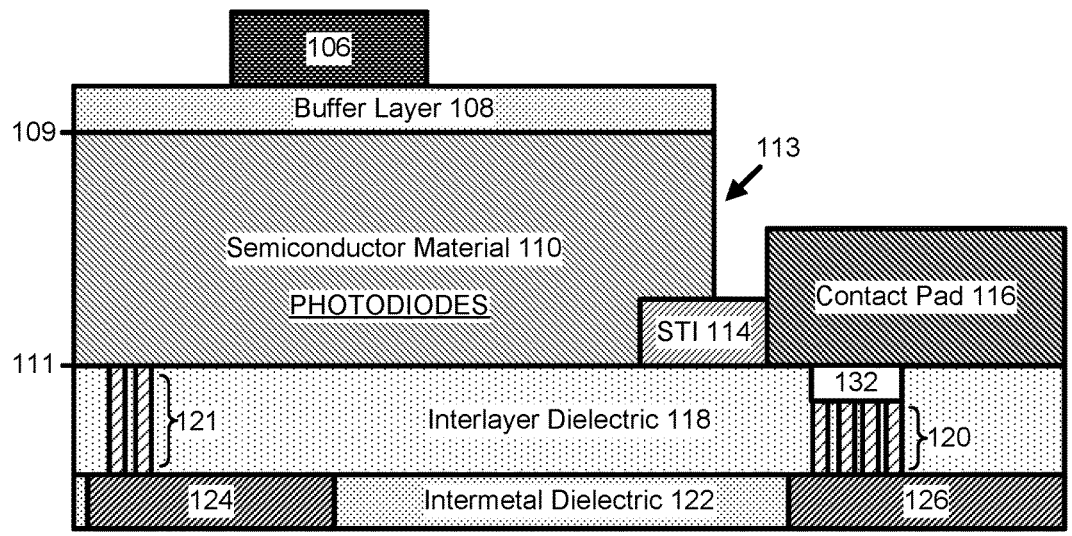
FIG. 1B is a cross sectional illustration of an example image sensor with an improved contact area, in accordance with the teachings of the present invention.

FIG. 1B is a cross sectional illustration of an example image sensor 100-B with improved contact area. Image sensor 100-B is similar to image sensor 100-A. However, one difference is image sensor 100-B includes landing pad 132 disposed within interlayer dielectric 118. Landing pad 132 is coupled between plurality of contact plugs 120 and contact pad 116. In one example, landing pad 132 may include polycrystalline silicon. Landing pad 132 may also allow for a simpler fabrication process as a self-alignment etch may be used to etch semiconductor material 110 to easily stop etching semiconductor material 110 upon reaching landing pad 132. Landing pad 132 may act as a barrier to prevent metal contamination. During fabrication of contact pad 116, landing pad 132 prevents metal from plurality of contact plugs 120 or metal interconnect 126 from being exposed during the etch process of semiconductor material 110. Moreover, landing pad 132 may reduce contact resistance between contact pad 116 and metal interconnect 126.

Figure 1C:
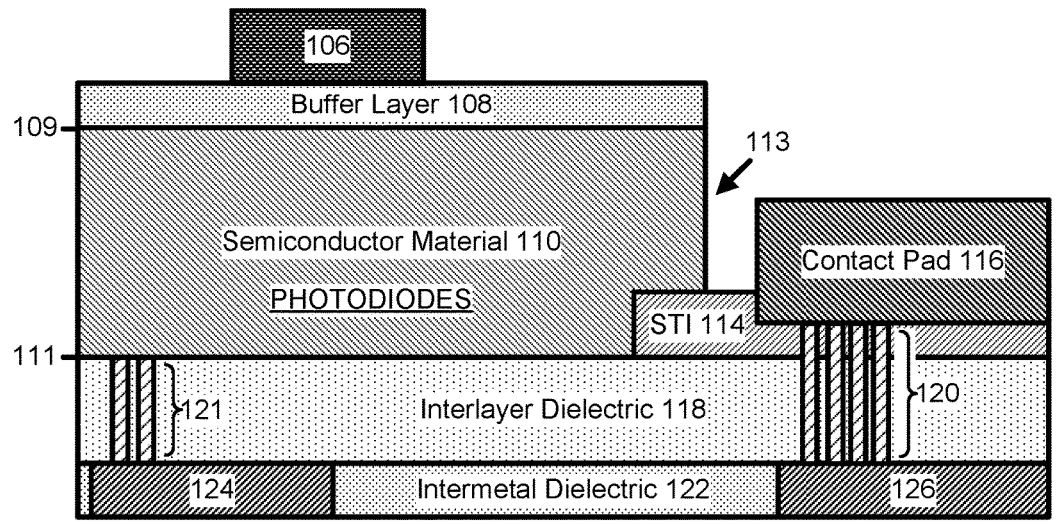
FIG. 1C is a cross sectional illustration of an example image sensor with an improved contact area, in accordance with the teachings of the present invention.

FIG. 1C is a cross sectional illustration of an example image sensor 100-C with improved contact area. Image sensor 100-C is similar to image sensor 100-B.

One difference is a second portion of STI structure 114 extends laterally from the first portion of STI structure 114 such that the second portion is disposed between contact pad 116 and metal interconnect 126. As illustrated, plurality of contact plugs 120 is partially disposed within the second portion of STI structure 114. In other words, plurality of contact plugs 120 extends beyond the entire thickness of interlayer dielectric 118 such that plurality of contact plugs 120 is at least partially disposed within the second portion of STI structure 114. Contact pad 116 may be at least partially disposed within STI structure 114 resulting in the thickness of STI structure 114 at the second portion to be less than the thickness of STI structure 114 at the first portion.

Figure 1D:
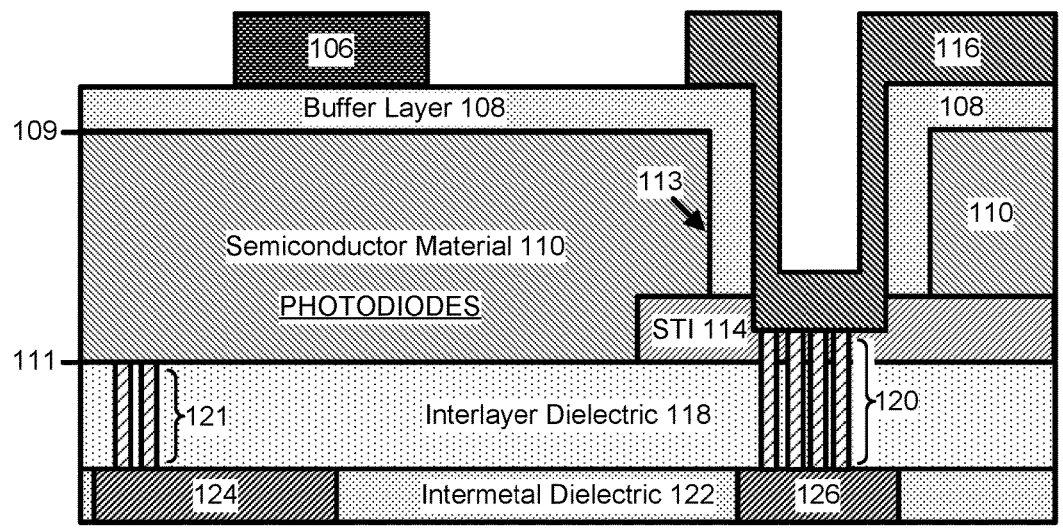
FIG.1D is a cross sectional illustration of an example image sensor with an improved contact area, in accordance with the teachings of the present invention.

FIG. 1D is a cross sectional illustration of an example image sensor 100-D with improved contact area. Image sensor 100-D is similar to image sensor 100-C. However, buffer layer 108 may extend from the back side of semiconductor material 110 to STI structure 114 such that at least part of buffer layer 108 is disposed between contact pad 116 and the lateral edge 113 of semiconductor material 110. Buffer layer 108 may prevent shorting between contact pad 116 and semiconductor material 110. Buffer layer 108 may be a single layer dielectric such as $SiO_2$ or may be formed from a plurality of layers of dielectrics. For example, buffer layer 108, may include a first high-k dielectric material such as $HfO_2$ as a first layer and $SiO_2$ as a second layer. The first layer may have a thickness less than the second layer and the first layer may be disposed between semiconductor material 110 and the second layer.

In one example, contact pad 116 may have a primary portion and a secondary portion. The primary portion of contact pad 116 may be disposed proximate to back side 109 of semiconductor material 110 such that at least part of buffer layer 108 is disposed between the primary portion and semiconductor material 110. The secondary portion of contact pad 116 may extend from the primary portion towards plurality of contact plugs 120 in order to couple contact pad 116 with the plurality of contact plugs. The secondary portion may also interface with STI structure 114 and plurality of contact plugs 120.

In another example, a thickness of contact pad 116 at the primary portion is the same as a thickness of back side metal 106 disposed proximate to back side 109 of semiconductor material 110. The primary portion of contact pad 116 may be disposed proximate to a second lateral edge opposite of lateral edge 113 of semiconductor material 110. The secondary portion of contact pad 116 may be disposed proximate to both lateral edge 113 and the second lateral edge of semiconductor material 110 to form a trench. A dielectric such as $SiO_2$ may be disposed within the trench in order to form a planar surface of contact pad 116.

Figure 2:
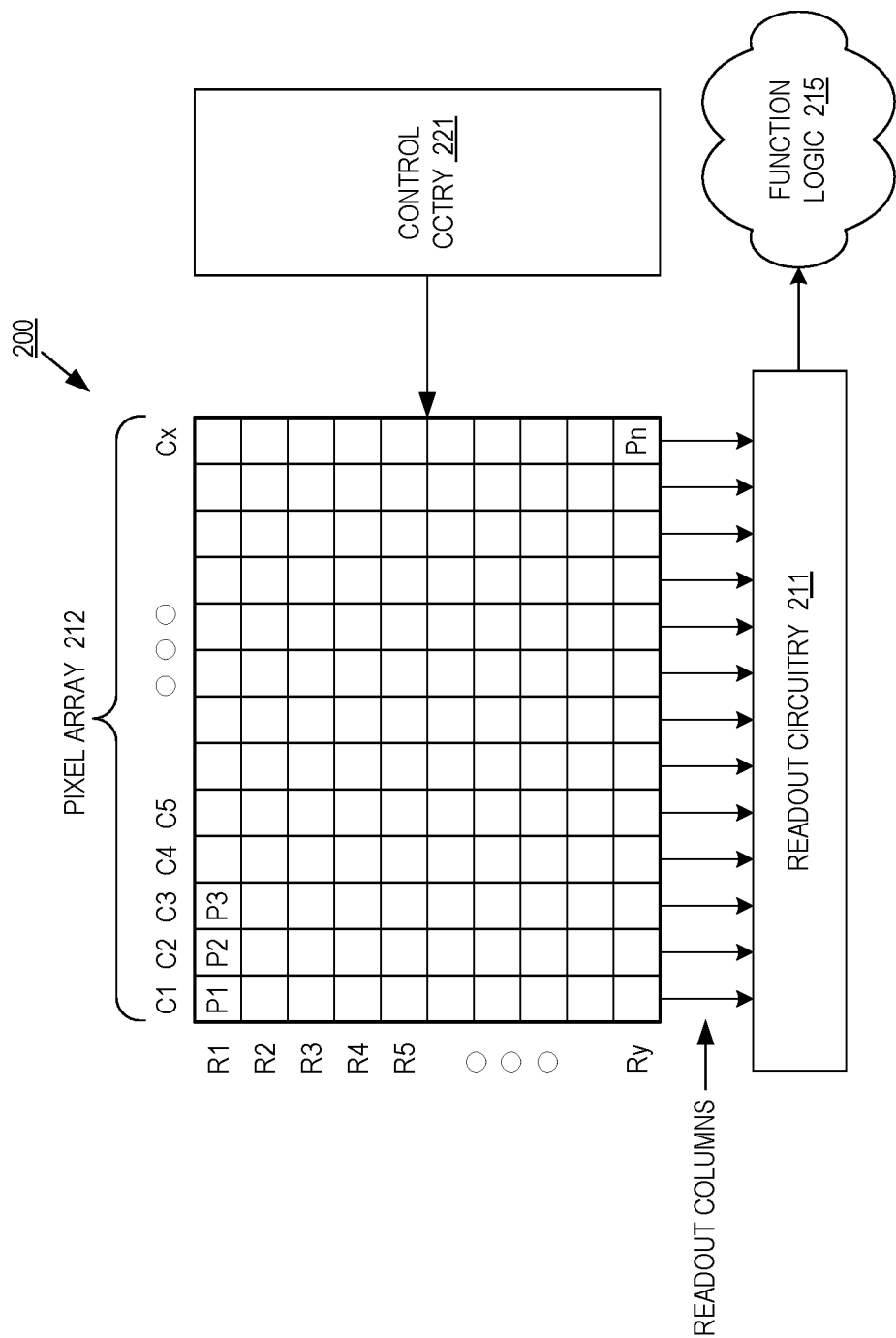
FIG. 2 is a block diagram illustrating one example of an imaging system which may include the image sensors of FIGS. 1A-1D, in accordance with the teachings of the present invention.

FIG. 2 is a block diagram illustrating one example of imaging system 200 which may include the image sensor 100 of FIGS. 1A-1D. Imaging system 200 includes pixel array 212, control circuitry 221, readout circuitry 211, and function logic 215. Although not depicted in FIGS. 1A-1D, readout circuitry 211 and control circuitry 221 may be at least partially disposed in intermetal dielectric 122 of FIGS. 1A-1D. For example, metal interconnect 126 may be included in at least one of readout circuitry and control circuitry.

Referring back to FIG. 2, in one example, pixel array 212 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 212 has acquired its image data or image charge, the image data is readout by readout circuitry 211 and then transferred to function logic 215. In various examples, readout circuitry 211 may include amplification circuitry, analog-to-digital conversion (ADC) circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 212 to control operation of the plurality of photodiodes in pixel array 212. For example, control circuitry 221 may generate a shutter signal for controlling image acquisition. In one example, the shutter signal is a global shutter signal for simultaneously enabling all pixels within pixel array 212 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
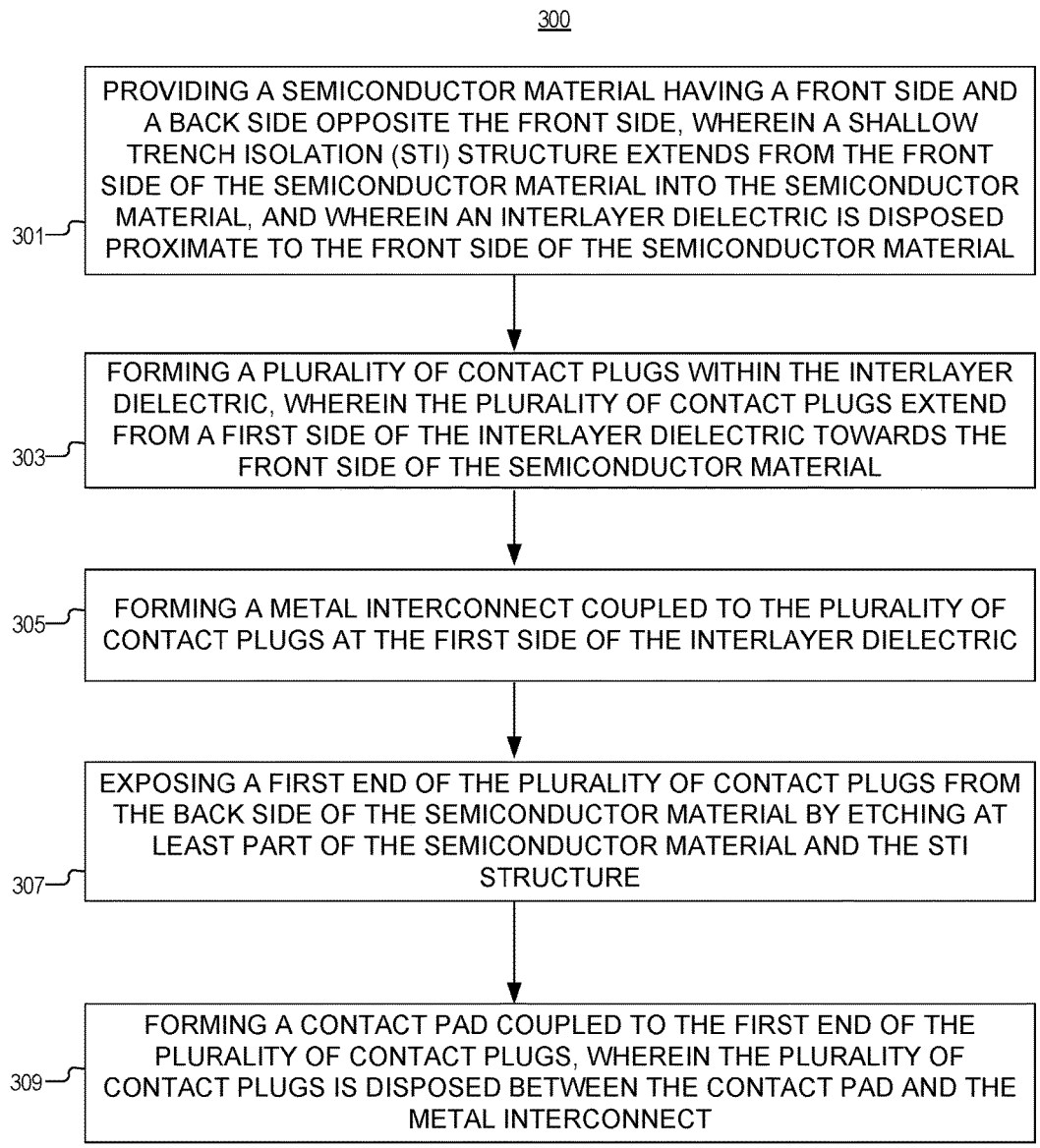
FIG. 3 illustrates an example method for forming the image sensor with an improved contact area of FIGS. 1A-1D, in accordance with the teachings of the present invention.

FIG. 3 illustrates an example method 300 for forming the image sensors of FIGS. 1A-1D. The order in which some or all process blocks appear in method 300 should not be deemed limited. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Process block 301 shows providing a semiconductor material having a front side and a back side opposite the front side. The provided semiconductor may include a shallow trench isolation (STI) structure that extends from the front side of the semiconductor material into the semiconductor material. An interlayer dielectric may be disposed proximate to the front side of the semiconductor material. The STI structure may be disposed between the semiconductor material and the interlayer dielectric.

Process block 303 shows forming a plurality of contact plugs within the interlayer dielectric. The semiconductor material may be positioned to perform processing steps from the front side towards the back side of the semiconductor material. In one example, the interlayer dielectric has a first side and a second side opposite the first side. The second side of the interlayer dielectric may be disposed between the front side of the semiconductor material and the first side of the interlayer dielectric. A plurality of openings in the interlayer dielectric may be formed by etching from the first side to the second side of the interlayer dielectric. The plurality of openings may be disposed proximate to the STI structure. In one example, the plurality of openings may be etched further such that they at least partially extend into the STI structure from the front side of the semiconductor material. The plurality of openings may be formed by using a dry etching technique such as $CF_4$ plasma etching. Other methods of etching may used to form the plurality of openings such as plasma etching, ion milling, sputtering, etc. The plurality of contact plugs may then be formed by depositing metal within the plurality of openings. In one example, the plurality of contact plugs includes tungsten metal.

In one example, a landing pad may be formed by depositing the landing pad on the first side of the semiconductor material proximate to the STI structure. The landing pad may be formed before the interlayer dielectric is formed. For example, the interlayer dielectric may be formed on both the front side of the semiconductor material and the landing pad. In one example, the landing pad may include polycrystalline silicon and may be formed using known techniques such as chemical vapor deposition. The landing pad may be disposed between the front side of the semiconductor material and the plurality of contact plugs.

A metal interconnect coupled to the plurality of contact plugs may then be formed by depositing metal proximate to the plurality of contact plugs on the first side of the interlayer dielectric. In one example, the metal interconnect includes copper metal. The metal interconnect may be formed via thermal evaporation, sputtering, etc. as one of ordinary skill in the art may appreciate. The plurality of contact plugs may be disposed between the STI structure and the metal interconnect.

After forming the plurality of contact plugs, the semiconductor material may be flipped over to perform processing steps from the back side towards the front side of the semiconductor material.

Process block 305 shows exposing a first end of the plurality of contact plugs from the back side of the semiconductor material. A deep trench may be formed by etching at least part of the semiconductor material and the STI structure from the back side towards the front side of the semiconductor material. The deep trench is etched deep enough such that a first end of the plurality of contact plugs proximate to the front side of the semiconductor material is exposed. In one example, forming the deep trench includes completely removing the semiconductor material proximate to the plurality of contact plugs and may also include partially removing the STI structure in order to expose the first end of the plurality of contact plugs or the landing pad.

Exposing a first end of the plurality of contact plugs may form a lateral edge of the semiconductor material. If the image sensor includes a landing pad, the deep trench may be etched to stop at the landing pad rather than the first end of the plurality of contact plugs.

Process block 307 shows forming a contact pad coupled to the first end of the plurality of contact plugs. The contact pad may be formed by depositing metal within the previously formed deep trench. In one example, the contact pad includes aluminum metal, copper metal, or a combination thereof. The contact pad may be formed directly on top of the plurality of contact plugs or landing pad. In another example, a primary portion of the contact pad may not be deposited directly on top of the plurality of contact plugs. In one example, the primary portion of the contact pad may be formed proximate to the buffer layer and semiconductor material and coupled to the plurality of contact plugs via a secondary portion of the contact pad. The plurality of contact plugs may be coupled between the contact pad and the metal interconnect to provide an electrical connection through the semiconductor material.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
    a semiconductor material having a front side and a back side opposite the front side;
    a shallow trench isolation (STI) structure extending from the front side of the semiconductor material into the semiconductor material;
    an interlayer dielectric disposed between the front side of the semiconductor material and an intermetal dielectric; and
    a contact area disposed proximate to a lateral edge of the semiconductor material, the contact area including:
        a metal interconnect disposed within the intermetal dielectric;
        a plurality of contact plugs at least partially disposed within the interlayer dielectric; and
        a contact pad, wherein the plurality of contact plugs is coupled between the contact pad and the metal interconnect.

2. The image sensor of claim 1, wherein the contact pad includes at least one of aluminum or copper, wherein the plurality of contact plugs includes tungsten, and wherein the metal interconnect includes copper.

3. The image sensor of claim 1, wherein the STI structure extends from the lateral edge of the semiconductor material towards the contact pad such that a first portion of the STI structure is disposed between the lateral edge of the semiconductor material and the contact pad.

4. The image sensor of claim 3, wherein a landing pad is disposed within the interlayer dielectric and is coupled between the plurality of contact plugs and the contact pad.

5. The image sensor of claim 4, wherein the landing pad includes polycrystalline silicon.

6. The image sensor of claim 3, wherein the contact pad interfaces with at least the STI structure and the interlayer dielectric.

7. The image sensor of claim 3, wherein a second portion of the STI structure extends from the first portion such that the second portion of the STI structure is disposed between the contact pad and the metal interconnect, and wherein the plurality of contact plugs is at least partially disposed within the second portion of the STI structure.

8. The image sensor of claim 7, wherein a thickness of the STI structure at the second portion is less than the thickness of the STI structure at the first portion.

9. The image sensor of claim 1, further comprising a buffer layer disposed on the back side of the semiconductor material.

10. The image sensor of claim 9, wherein the buffer layer extends from the back side of the semiconductor material to the STI structure such that at least part of the buffer layer is disposed between the contact pad and the lateral edge of the semiconductor material.

11. The image sensor of claim 10, wherein the buffer layer is disposed between the back side of the semiconductor material and a primary portion of the contact pad, wherein a secondary portion of the contact pad extends from the primary portion towards the plurality of contact plugs, and wherein the secondary portion of the contact pad interfaces with the STI structure and the plurality of contact plugs.

12. The image sensor of claim 11, wherein a thickness of the contact pad at the primary portion is the same as a thickness of a back side metal disposed proximate to the back side of the semiconductor material.

13. An imaging system, comprising:
    a plurality of photodiodes disposed in a semiconductor material having a front side and a back side opposite of the front side;
    a shallow trench isolation (STI) structure extending from the front side of the semiconductor material into the semiconductor material;
    an interlayer dielectric disposed on the front side of the semiconductor material;
    a contact area disposed proximate to a lateral edge of the semiconductor material, the contact area including:
        a metal interconnect;
        a plurality of contact plugs at least partially disposed within the interlayer dielectric;
        a contact pad, wherein the plurality of contact plugs is coupled between the contact pad and the metal interconnect; and
    control circuitry and readout circuity, wherein the metal interconnect is included in at least one of the control circuitry or the readout circuity.

14. The imaging system of claim 13, wherein the STI structure extends from the lateral edge of the semiconductor material towards the contact pad such that a first portion of the STI structure is disposed between the lateral edge of the semiconductor material and the contact pad.

15. The imaging system of claim 14, wherein a second portion of the STI structure extends from the first portion such that the second portion of the STI structure is disposed between the contact pad and the metal interconnect, and wherein the plurality of contact plugs extends through the second portion of the STI structure.

16. The imaging system of claim 13, wherein the control circuitry is at least partially disposed in an intermetal dielectric and includes the metal interconnect, wherein the interlayer dielectric is disposed between the semiconductor material and the intermetal dielectric, and wherein the control circuity controls operation of the plurality of photodiodes.

17. The imaging system of claim 16, further comprising readout circuitry at least partially disposed in the intermetal dielectric and coupled to read out image data from the plurality of photodiodes.

18. A method of image sensor fabrication, comprising:
providing a semiconductor material having a front side and a back side opposite the front side, wherein a shallow trench isolation (STI) structure extends from the front side of the semiconductor material into the semiconductor material, and wherein an interlayer dielectric is disposed proximate to the front side of the semiconductor material;
forming a plurality of contact plugs within the interlayer dielectric, wherein the plurality of contact plugs extends from a first side of the interlayer dielectric towards the front side of the semiconductor material;
forming a metal interconnect coupled to the plurality of contact plugs at the first side of the interlayer dielectric;
after forming a plurality of contact plugs, exposing a first end of the plurality of contact plugs from the back side of the semiconductor material by etching at least part of the semiconductor material and the STI structure; and
after exposing the first end of the plurality of contact plugs, forming a contact pad coupled to the first end of the plurality of contact plugs, wherein the plurality of contact plugs is disposed between the contact pad and the metal interconnect.

19. The method of claim 18, wherein exposing the first end of the plurality of contact plugs includes forming a lateral edge of the semiconductor material, wherein a first portion of the STI structure is disposed between the lateral edge of the semiconductor material and the contact pad, and wherein the plurality of contact plugs is at least partially disposed within the STI structure.

20. The method of claim 18, further including forming a landing pad within the interlayer dielectric and coupled between the plurality of contact plugs and the contact pad.

* * * * *